United States Patent
Zhao et al.

(10) Patent No.: US 12,087,385 B2
(45) Date of Patent: Sep. 10, 2024

(54) METHOD FOR OBTAINING CIRCUIT NOISE PARAMETERS AND ELECTRONIC DEVICE

(71) Applicant: CHANGXIN MEMORY TECHNOLOGIES, INC., Hefei (CN)

(72) Inventors: Kang Zhao, Hefei (CN); Weibing Shang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 109 days.

(21) Appl. No.: 17/953,297

(22) Filed: Sep. 26, 2022

(65) Prior Publication Data
US 2023/0013029 A1 Jan. 19, 2023

Related U.S. Application Data

(63) Continuation of application No. PCT/CN2022/107178, filed on Jul. 21, 2022.

(30) Foreign Application Priority Data

Jun. 14, 2022 (CN) .......................... 202210685219.4

(51) Int. Cl.
*G11C 7/08* (2006.01)
*G11C 29/02* (2006.01)

(52) U.S. Cl.
CPC .............. *G11C 7/08* (2013.01); *G11C 29/025* (2013.01); *G11C 29/026* (2013.01)

(58) Field of Classification Search
CPC .................................................. G11C 29/025
(Continued)

(56) References Cited

U.S. PATENT DOCUMENTS

| 5,999,010 A | 12/1999 | Arora |
|---|---|---|
| 2002/0116696 A1 | 8/2002 | Suaya et al. |

(Continued)

FOREIGN PATENT DOCUMENTS

| CN | 101946287 B | 7/2014 |
|---|---|---|
| CN | 107907811 A | 4/2018 |
| CN | 113295930 A | 8/2021 |

OTHER PUBLICATIONS

ISA State Intellectual Property Office of the People's Republic of China, International Search Report Issued in Application No. PCT/CN2022/107178, Dec. 22, 2022, WIPO, 8 pages.

*Primary Examiner* — Anthan Tran
(74) *Attorney, Agent, or Firm* — Kilpatrick Townsend & Stockton LLP

(57) ABSTRACT

A method for obtaining circuit noise parameters and an electronic device are provided. The method includes: determining a plurality of circuits to be tested, where each circuit includes one or more signal lines, and each circuit has at least one operating state; obtaining a parasitic capacitance between each signal line and all others signal lines, and determining a logic state of each signal line under each of the operating states; determining a plurality of operating state combinations for the plurality of circuits to be tested, and determining one target operating state combination from the plurality of operating state combinations; and under the target operating state combination, determining noise parameters of each one of the signal lines to be tested according to the logic state of each one of the signal lines to be tested and the parasitic capacitance.

16 Claims, 5 Drawing Sheets

(58) Field of Classification Search
USPC .......................................................... 365/207
See application file for complete search history.

(56) References Cited

U.S. PATENT DOCUMENTS

| | | | |
|---|---|---|---|
| 2004/0227527 A1 | 11/2004 | Bortesi et al. | |
| 2013/0286716 A1* | 10/2013 | Rountree | G11C 11/418 |
| | | | 365/230.01 |
| 2014/0192603 A1* | 7/2014 | Singh | G11C 7/065 |
| | | | 365/207 |
| 2015/0198657 A1* | 7/2015 | Coutts | G01R 27/2605 |
| | | | 324/658 |
| 2019/0066737 A1* | 2/2019 | Sugimoto | G11C 8/10 |
| 2022/0059418 A1 | 2/2022 | Makabe | |

* cited by examiner

100

S1: Determine a plurality of circuits to be tested, where each one of the plurality of circuits to be tested comprises one or more signal lines to be tested, and each one of the plurality of circuits to be tested has at least one operating state S2: Obtain a parasitic capacitance between each one of the signal lines to be tested and all others of the signal lines to be tested, and determine a logic state of each one of the signal lines to be tested in each one of the plurality of circuits to be tested under each of the operating states S3: Determine a plurality of operating state combinations for the plurality of circuits to be tested, and determine one target operating state combination from the plurality of operating state combinations S4: Under the target operating state combination, determine noise parameters of each one of the signal lines to be tested according to the logic state of each one of the signal lines to be tested and the parasitic capacitance, where the noise parameters comprise external noise parameters caused by others of the plurality of circuits to be tested and internal noise parameters of a given one of the plurality of circuits to be tested corresponding to a given one of the plurality of signal lines to be tested

S11: Obtain a plurality of functional circuits, and determine whether there is a logic state restriction relationship between different functional circuits S12: Determine the plurality of functional circuits having the logic state restriction relationship as one of the plurality of circuits to be tested S13: Determine the plurality of functional circuits without the logic state restriction relationship as the plurality of circuits to be tested one by one respectively

S41 — Determine a target signal line from the plurality of signal lines to be tested, and determine all parasitic capacitances corresponding to the target signal line as target parasitic capacitances S42 — Determine the target parasitic capacitances of the first polarity and the target parasitic capacitances of the second polarity according to the logic state of each one of the signal lines to be tested S43 — Add the target parasitic capacitances of the first polarity together to obtain a first capacitance, and add the target parasitic capacitances of the second polarity together to obtain a second capacitance S44 — Obtain noise parameters of the target signal line on the basis of a difference between an absolute value of the first capacitance and an absolute value of the second capacitance

Fig. 3

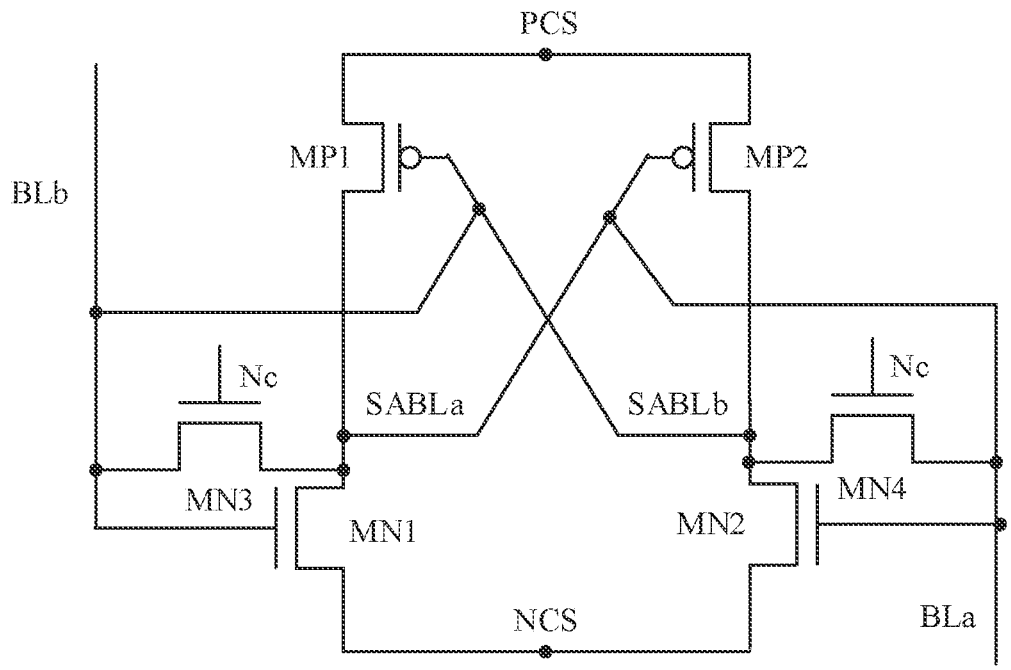

Fig. 4

METHOD FOR OBTAINING CIRCUIT NOISE PARAMETERS AND ELECTRONIC DEVICE

CROSS-REFERENCE TO RELATED APPLICATION

The present disclosure is a continuation of PCT/CN2022/107178, filed on Jul. 21, 2022, which claims priority to Chinese Patent Application No. 202210685219.4 titled "METHOD FOR OBTAINING CIRCUIT NOISE PARAMETERS AND ELECTRONIC DEVICE" and filed on Jun. 14, 2022, the entire contents of which are incorporated herein by reference.

TECHNICAL FIELD

The present disclosure relates to the field of integrated circuit manufacturing technology, and more particularly, to a method for obtaining circuit noise parameters and an electronic device.

BACKGROUND

In design of integrated circuits, a parasitic capacitance and a coupling capacitance between signal lines are important indicators for estimating signal quality. In related technologies, generally the parasitic capacitance between the signal lines is manually analyzed after a circuit model is established using a simulation tool, and variations of the parasitic capacitance of each signal line in different operating states of the circuits are considered. Because generally there are thousands of signal lines in the integrated circuits, manual operations are time-consuming and labor-consuming, especially after layout is revised, all analyses need to be remade, resulting in lower efficiency in development and analysis.

It is to be noted that the information disclosed in the above background art section is only for enhancement of understanding of the background of the present disclosure, and therefore may include information that does not constitute the prior art that is already known to a person of ordinary skill in the art.

SUMMARY

An objective of the present disclosure is to provide a method for obtaining circuit noise parameters and an electronic device.

According to a first aspect of embodiments of the present disclosure, there is provided a method for obtaining circuit noise parameters. The method includes: determining a plurality of circuits to be tested, where each one of the plurality of circuits to be tested includes one or more signal lines to be tested, and each one of the plurality of circuits to be tested has at least one operating state; obtaining a parasitic capacitance between each one of the signal lines to be tested and all others of the signal lines to be tested, and determining a logic state of each one of the signal lines to be tested in each one of the plurality of circuits to be tested under each of the operating states; determining a plurality of operating state combinations for the plurality of circuits to be tested, and determining one target operating state combination from the plurality of operating state combinations; and under the target operating state combination, determining noise parameters of each one of the signal lines to be tested according to the logic state of each one of the signal lines to be tested and the parasitic capacitance, where the noise parameters include external noise parameters caused by others of the plurality of circuits to be tested and internal noise parameters of a given one of the plurality of circuits to be tested corresponding to a given one of the plurality of signal lines to be tested.

According to a second aspect of the present disclosure, there is provided an electronic device, which includes: a memory, and a processor coupled to the memory. The processor is configured to perform the method according to any one of the above embodiments based on instructions stored in the memory.

According to a third aspect of the present disclosure, there is provided a computer-readable storage medium having a program stored thereon, the program is executable by a processor, whereby the method for obtaining circuit noise parameters according to any one of the above embodiments is implemented.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

FIG. 1 is a flowchart of a method for obtaining circuit noise parameters in an exemplary embodiment of the present disclosure;

FIG. 2 is a sub flowchart of Step S1 in one embodiment of the present disclosure;

FIG. 3 is a sub flowchart of Step S4 in one embodiment of the present disclosure;

FIG. 4 is a circuit diagram of a sense amplifier in one embodiment of the present disclosure;

DETAILED DESCRIPTION

Figure 5:
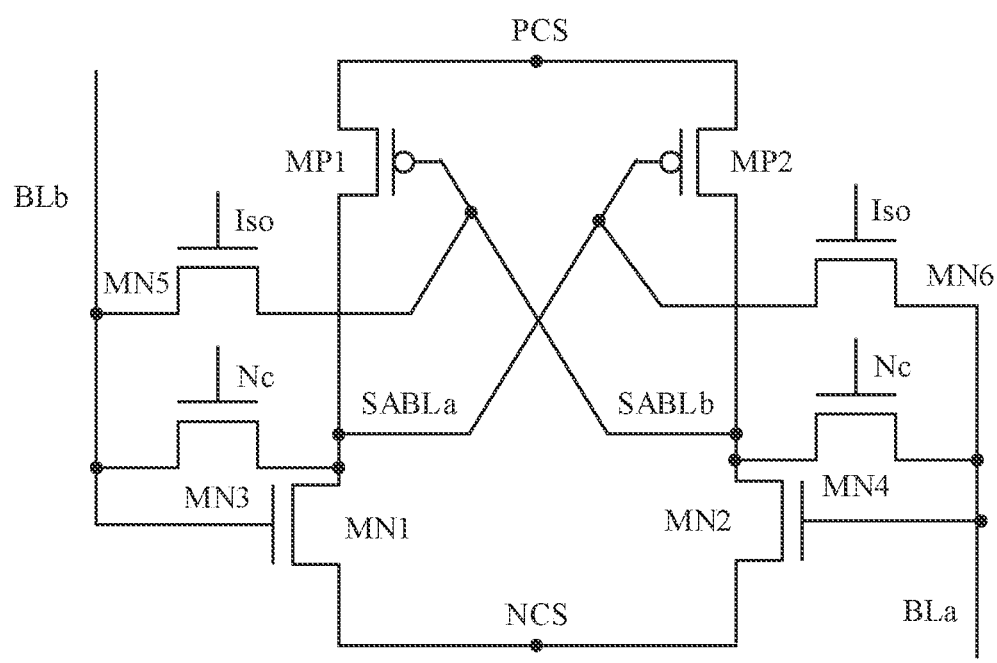
FIG. 5 is a circuit diagram of a sense amplifier in another embodiment of the present disclosure.

Exemplary embodiments will now be described more comprehensively with reference to the accompanying drawings. However, the exemplary embodiments can be embodied in many forms and should not be construed as being limited to the embodiments set forth herein; rather, these embodiments are provided such that the present disclosure will be more thorough and complete, and the concept of the exemplary embodiments will be fully conveyed to those skilled in the art. Furthermore, the described features, structures, or characteristics may be combined in any suitable manner in one or more embodiments. In the following description, numerous details are provided to provide a thorough understanding of the embodiments of the present disclosure. Those skilled in the art will recognize, however, that the technical solution of the present disclosure may be practiced without one or more of the details described, or that other methods, components, apparatuses, steps and so on may be employed. In other instances, well-known technical solutions are not shown or described in detail to avoid obscuring aspects of the present disclosure.

Furthermore, the accompanying drawings are merely schematic illustrations of the present disclosure. Same or similar parts are denoted by same reference numbers in the drawings and, thus, a detailed description thereof will be omitted. Some block diagrams shown in the accompanying drawings are functional entities and not necessarily to be corresponding to physically or logically individual entities. These functional entities may be implemented in software form, or implemented in one or more hardware circuits or integrated circuits, or implemented in different networks and/or processor apparatuses and/or microcontroller apparatuses.

A detailed description of the exemplary embodiments of the present disclosure will be made in the following with reference to the accompanying drawings.

FIG. 1 is a flowchart of a method for obtaining circuit noise parameters in an exemplary embodiment of the present disclosure.

Referring to FIG. 1, a method 100 for obtaining circuit noise parameters may include:

Step S1, determining a plurality of circuits to be tested, where each one of the plurality of circuits to be tested comprises one or more signal lines to be tested, and each one of the plurality of circuits to be tested has at least one operating state;

Step S2, obtaining a parasitic capacitance between each one of the signal lines to be tested and all others of the signal lines to be tested, and determining a logic state of each one of the signal lines to be tested in each one of the plurality of circuits to be tested under each of the operating states;

Step S3, determining a plurality of operating state combinations for the plurality of circuits to be tested, and determining one target operating state combination from the plurality of operating state combinations; and Step S4, under the target operating state combination, determining noise parameters of each one of the signal lines to be tested according to the logic state of each one of the signal lines to be tested and the parasitic capacitance, where the noise parameters comprise external noise parameters caused by others of the plurality of circuits to be tested and internal noise parameters of a given one of the plurality of circuits to be tested corresponding to a given one of the plurality of signal lines to be tested.

According to the embodiments of the present disclosure, a logic state of each signal line to be tested under each circuit operating state combination is determined by automatically obtaining a capacitance between the signal lines to be tested, and then noise parameters of each signal line to be tested under different circuit operating state combinations are automatically calculated out according to different logic states, such that efficiency of obtaining the noise parameters can be greatly improved, and development efficiency of integrated circuits can be effectively improved.

Each step of the method 100 for obtaining circuit noise parameters will be described in detail below.

In Step S1, a plurality of circuits to be tested are determined, each of the plurality of circuits to be tested includes one or more signal lines to be tested, and each of the plurality of circuits to be tested has at least one operating state.

In one embodiment of the present disclosure, the circuit to be tested is, for example, a circuit module having a certain function, such as an amplifying circuit and a driving circuit or the like; and elements between different circuit modules are independent of each other and may be communicated by means of one or more signal lines. There may also be a plurality of signal lines in the circuit to be tested. When determining the signal lines to be tested, all or part of the signal lines inside the circuit to be tested may be determined as the signal lines to be tested, and one signal line to be tested may be connected to one or more circuits to be tested. When one signal line to be tested is connected to a plurality of circuits to be tested, the signal line to be tested may be assigned to one of the circuits to be tested, such as the circuit to be tested at a signal input terminal of the signal line to be tested, or the circuit to be tested at a signal output terminal of the signal line to be tested; or, each part of the signal line to be tested positioned on different circuits to be tested is used as a separate signal line to be tested, and different separate signal lines to be tested have the same logic state.

In some embodiments, the signal line to be tested may further include a control signal line, and the control signal line includes a power line and a signal line for transmitting an enable signal.

Each circuit to be tested has at least one operating state, some circuits to be tested have a plurality of operating states, and in each operating state, the logic state of a signal line to be tested corresponding to one circuit to be tested may change. That is, in each operating state, all signal lines to be tested corresponding to one circuit to be tested have one logic state combination, and logic state combinations for the signal lines to be tested corresponding to one circuit to be tested under different operating states may be exactly the same, completely different, or not identical.

In some cases, due to sharing one or more signal lines, there is a logic state restriction relationship between some circuits, resulting in a consequence that the operating states of one or more circuits always appear at the same time. When the operating states of the circuits to be tested are arranged and combined at this moment, there may appear an unrealizable operating state combination relationship. Therefore, when determining circuits to be tested, circuits having the logic state restriction relationship may be packaged into one circuit to be tested first, to measure their operating states as a whole.

FIG. 2 is a sub flowchart of Step S1 in one embodiment of the present disclosure.

Referring to FIG. 2, in one embodiment, Step S1 may include:

Step S11, obtaining a plurality of functional circuits, and determining whether there is a logic state restriction relationship between different functional circuits;

Step S12, determining the plurality of functional circuits having the logic state restriction relationship as one of the plurality of circuits to be tested; and Step S13, determining the plurality of functional circuits without the logic state restriction relationship as the plurality of circuits to be tested one by one respectively.

In the embodiment shown in FIG. 1, the functional circuit is, for example, a circuit capable of separately performing one function, such as an inverter and an amplifying circuit, etc. The logic state restriction relationship may include a control relationship, a parallel relationship, or a series relationship, etc. For example, when an output terminal of one inverter is configured to output an enable control signal of one functional circuit and output a first level, the functional circuit is enabled, and when the output terminal of the inverter is configured to output a second level, the functional circuit is disabled. In this case, the inverter may constitute one circuit to be tested together with the functional circuit, which has two operating states of enable and disable. The above example is only provided for convenience of understanding. In practical applications, there may be a variety of logic state restriction relationships between the functional circuits, which may be set by those skilled in the art according to actual design.

After the functional circuits having the logic state restriction relationship are packaged into one circuit to be tested to determine the operating state, other functional circuits having independent operating states/logic states may be used as circuits to be tested separately to form an operating state combination subsequently.

In Step S2, it is obtained a parasitic capacitance between each one of the signal lines to be tested and all others of the signal lines to be tested, and it is determined a logic state of each one of the signal lines to be tested in each one of the plurality of circuits to be tested under each of the operating states.

In one embodiment of the present disclosure, the parasitic capacitance between the signal lines to be tested may be obtained based on a post-simulation result. A post-simulation tool may automatically capture the parasitic capacitance between different signal lines according to layout design parameters, and by means of screening, all the parasitic capacitances corresponding to each signal line to be tested are determined therefrom.

In addition, because the circuit to be tested corresponds to the logic state combination for one group of signal lines to be tested in each operating state, the logic states of each signal line to be tested corresponding to the circuit to be tested under different operating states may be determined using a simulation tool according to a connection relationship between the signal lines and a circuit design principle. Because the logic states of different circuits to be tested are independent of each other after the processing shown in FIG. 2, in this step, it is not necessary to set the operating state combination for the circuit to be tested, and one operating state of one circuit to be tested only needs to be measured once, thereby improving the test efficiency.

As can be seen, in the embodiment shown in FIG. 2, the circuits to be tested are divided according to a logic state association relationship, which may greatly improve the test efficiency.

In Step S3, a plurality of operating state combinations are determined for the plurality of circuits to be tested, and one target operating state combination is determined from the plurality of operating state combinations.

Different operating states of the plurality of circuits to be tested may form the plurality of operating state combinations, and the operating states of all the circuits to be tested corresponding to each of the operating state combinations are not completely coincident.

For example, a circuit A to be tested has two operating states of A1 and A2, and a circuit B to be tested has two operating states of B1 and B2. In this case, the circuit A to be tested and the circuit B to be tested correspond to four operating state combinations of (A1, B1), (A2, B2), (A1, B2), and (A2, B1). Correspondingly, in each operating state, there is one group of logic state combinations for the signal lines to be tested. Under one operating state combination, the logic states of all the signal lines to be tested corresponding to the circuit A to be tested and the circuit B to be tested also constitute one logic state combination. Under the four operating state combinations, there are four logic state combinations for the signal lines to be tested. The above numbers are only examples. In practical applications, there may be more circuits to be tested, there may be more operating states of each circuit to be tested, and there may also be more operating state combinations.

In the test process, first, one operating state combination may be selected as a target operating state combination for calculation. After calculating all the noise parameters corresponding to one target operating state combination, other operating state combinations may be set as target operating state combinations, and calculation of the same process is performed until the noise parameters corresponding to each signal line to be tested are determined under all the operating state combinations corresponding to the current plurality of circuits to be tested.

In Step S4, under the target operating state combination, noise parameters of each one of the signal lines to be tested are determined according to the logic state of each one of the signal lines to be tested and the parasitic capacitance, where the noise parameters comprise external noise parameters caused by others of the plurality of circuits to be tested and internal noise parameters of a given one of the plurality of circuits to be tested corresponding to a given one of the plurality of signal lines to be tested.

In one embodiment, the logic state may include a first logic state and a second logic state opposite to each other, the parasitic capacitance between two of the signal lines to be tested having the same logic state is a first polarity, the parasitic capacitance between two of the signal lines to be tested having different logic states is a second polarity, and the first polarity is opposite to the second polarity.

For example, it is assumed that there is a parasitic capacitance C12 between a signal line 1 to be tested and a signal line 2 to be tested, the first polarity is positive (represented by "+"), and the second polarity is negative (represented by "−"). When the signal line 1 to be tested is in the first logic state and the signal line 2 to be tested is in the first logic state, or when the signal line 1 to be tested is in the second logic state and the signal line 2 to be tested is in the second logic state, there is a parasitic capacitance +C12. When the signal line 1 to be tested is in the first logic state and the signal line 2 to be tested is in the second logic state, or when the signal line 1 to be tested is in the second logic state and the signal line 2 to be tested is in the first logic state, and there is a parasitic capacitance −C12.

FIG. 3 is a sub flowchart of Step S4 in one embodiment of the present disclosure.

Referring to FIG. 3, in one embodiment, Step S4 may include:

Step S41, determining a target signal line from the plurality of signal lines to be tested, and determining all parasitic capacitances corresponding to the target signal line as target parasitic capacitances;

Step S42, determining the target parasitic capacitances of the first polarity and the target parasitic capacitances of the second polarity according to the logic state of each one of the signal lines to be tested;

Step S43, adding the target parasitic capacitances of the first polarity together to obtain a first capacitance, and adding the target parasitic capacitances of the second polarity together to obtain a second capacitance; and Step S44, obtaining noise parameters of the target signal line on the basis of a difference between an absolute value of the first capacitance and an absolute value of the second capacitance.

In the embodiment as shown in FIG. 3, sum of the parasitic capacitances of the target signal lines is set as the noise parameters of the target signal lines, and noises of the signal lines may be quickly and accurately evaluated by using the sum of the parasitic capacitances as the noise parameters. The parasitic capacitance in the embodiments of the present disclosure refers to a capacitance that exists between two signal lines, is not in the circuit design solution and is caused by layout, no matter what the actual function of the capacitance is (for example, it may also be called a coupling capacitance).

It is to be understood that under one target operating state combination, there may exist a case where one or more circuits to be tested do not operate (for example, disabled or turned off), and in this case, the signal line to be tested corresponding to the circuit to be tested may not operate, and does not have an operating state (that is, the parasitic capacitance between this signal line and other signal lines is 0). Therefore, in the embodiment as shown in FIG. 3, a plurality of signal lines to be tested having operating states may be determined under the target operating state combinations, and then one target signal line for calculation is determined from the plurality of signal lines to be tested.

Next, the polarity of the target parasitic capacitance is determined according to the logic state of the target signal line. When the target signal line is currently in the first logic state, the parasitic capacitance between the target signal line and other signal lines to be tested in the first logic state is the first polarity, and the parasitic capacitance between the target signal line and other signal lines to be tested in the second logic state is the second polarity. When the target signal line is currently in the second logic state, the parasitic capacitance between the target signal line and other signal lines to be tested in the first logic state is the second polarity, and the parasitic capacitance between the target signal line and other signal lines to be tested in the second logic state is the first polarity.

Next, the sum of the parasitic capacitances of the first polarity corresponding to the target signal lines and the sum of the parasitic capacitances of the second polarity corresponding to the target signal lines are calculated respectively. The target signal line is numbered as 1, and the other signal lines to be tested are numbered as 2, 3, and 4. Under the current operating state combination, the logic state of the target signal line 1 is the first logic state, and the logic states of the signal lines 2, 3, and 4 to be tested are respectively the first logic state, the second logic state, and the second logic state. When the first polarity is set to be positive, the target parasitic capacitances corresponding to the target signal lines are respectively +C12, −C13, and −C14, the sum of the target parasitic capacitances of the first polarity, namely the absolute value of the first capacitance, is equal to C12; and the sum of the target parasitic capacitances of the second polarity, namely the absolute value of the second capacitance, is equal to C13+C14.

As can be seen, the first capacitance is the first polarity, and the second capacitance is the second polarity. When the first polarity is set to be positive, the first capacitance may be used as a minuend, the second capacitance may be used as a subtrahend, and the noise parameters of the target signal line 1 are obtained according to the difference between the absolute value of the first capacitance and the absolute value of the second capacitance. That is, the sum of the parasitic capacitances is C12−(C13+C14).

After the noise parameters of one target signal line are calculated, other signal lines to be tested may be replaced as the target signal line for calculation until the noise parameters corresponding to all the signal lines to be tested under the target operating state combination are calculated.

In addition to the measurement in the unit of the signal line to be tested, the measurement may also be performed in the unit of the circuit to be tested, to obtain the noise parameters of each circuit to be tested under different operating state combinations.

In one embodiment, one target circuit to be tested may be determined from the circuits to be tested, and then the noise parameters corresponding to the circuits to be tested under the target operating state combination are determined according to the noise parameters of all the signal lines to be tested corresponding to the target circuit to be tested.

It is assumed that the circuit A to be tested has two signal lines 1 and 2 to be tested, and the noise parameters of the signal lines 1 and 2 to be tested under the target operating state are C1 and C2 respectively. It is to be understood that, because the first capacitance and the second capacitance configured to calculate the noise parameters of the signal lines to be tested have polarities, the noise parameters C1 and C2 of the signal lines 1 and 2 to be tested also have polarities. In this case, the noise parameters of the circuit A to be tested may be obtained as one or more of |C1|+|C2|, |C1|−|C2|, and |C2|−|C1| according to the polarities of the noise parameters C1 and C2. According to a calculation result, the noise parameters of the circuit A to be tested also have polarities.

When there are a variety of classifications of signal lines to be tested, the noise parameters of the circuit to be tested may also be measured for each category of signal lines to be tested. The categories of the signal lines to be tested may include common signal lines and control signal lines, where the control signal lines may include power lines and signal lines configured to transmit enable signals.

In one embodiment of the present disclosure, the classifications of all the signal lines to be tested may be determined first according to signal types, then all the signal lines to be tested corresponding to the target circuit to be tested are determined as the target signal lines, and the sum of a plurality of parasitic capacitances between all the target signal lines and the signal lines to be tested in different classifications is used as classification noise parameters of the target circuit to be tested.

For example, when all the signal lines to be tested are classified into the common signal lines and the control signal lines, the sum of the parasitic capacitances of the target signal line and all the common signal lines in the target operating state may be used as the noise parameters of the common signal lines of the target circuit to be tested, and the sum of the parasitic capacitances of the target signal line and all the control signal lines under the target operating state is used as the noise parameters of the control signal lines of the target circuit to be tested. Obtaining the classification noise parameters may facilitate more detailed analysis of circuit design.

Furthermore, the noise parameters corresponding to the target circuit to be tested may also be obtained according to the sum of all the classification noise parameters corresponding to the target circuit to be tested. After one target circuit to be tested is calculated, each circuit to be tested may also be set as the target circuit to be tested, to obtain the noise parameters corresponding to each circuit to be tested under each operating state combination.

It should be noted that no matter which one of the above noise parameters is obtained, the final calculation result may retain the capacitance polarities for subsequent further calculations.

By means of the method for obtaining circuit noise parameters provided by the embodiments of the present disclosure, the noise parameters of each unit to be tested (signal lines to be tested, circuits to be tested, and even chips to be tested) under a plurality of circuit operating states may be quickly and accurately obtained, thereby greatly improving feedback data analysis efficiency of the circuit design.

The methods of the embodiments of the present disclosure will be explained below by means of concrete circuits.

In one embodiment, the circuit to be tested may include a sense amplifier (SA), and Step S1 may include: determining logic states of the plurality of signal lines to be tested corresponding to the sense amplifier in different operating states, where the operating states comprise at least an amplified state and an unamplified state, and the amplified state comprises an amplified state where a bit line is in the first logic state and an amplified state where the bit line is in the second logic state. The first logic state is, for example, logic 1, and the second logic state is, for example, logic 0.

FIG. 4 is a circuit diagram of a sense amplifier in one embodiment of the present disclosure.

Referring to FIG. 4, a sense amplifier 400 may include:
- a first P-type transistor MP1, a source of the first P-type transistor MP1 being electrically connected to a first power line PCS, a drain of the first P-type transistor MP1 being connected to a first sense control signal line SABLa, and a gate of the first P-type transistor MP1 being connected to a second sense control signal line SABLb;
- a second P-type transistor MP2, a source of the second P-type transistor MP2 being electrically connected to the first power line PCS, a drain of the second P-type transistor MP2 being connected to the second sense control signal line SABLb, and a gate of the second P-type transistor MP2 being connected to the first sense control signal line SABLa;
- a first N-type transistor MN1, a source of the first N-type transistor MN1 being electrically connected to a second power line NCS, a drain of the first N-type transistor MN1 being connected to the first sense control signal line SABLa, and a gate of the first N-type transistor MN1 being connected to a complementary bit line BLb;
- a second N-type transistor MN2, a source of the second N-type transistor MN2 being electrically connected to the second power line NCS, a drain of the second N-type transistor MN2 being connected to the second sense control signal line SABLb, and a gate of the second N-type transistor MN2 being connected to a bit line BLa;
- a third N-type transistor MN3, a first terminal of the third N-type transistor MN3 being connected to the complementary bit line BLb, a second terminal of the third N-type transistor MN3 being connected to the first sense control signal line SABLa, and a control terminal of the third N-type transistor MN3 being connected to an amplification stop signal Nc; and
- a fourth N-type transistor MN4, a first terminal of the fourth N-type transistor MN4 being connected to the bit line BLa, a second terminal of the fourth N-type transistor MN4 being connected to the second sense control signal line SABLb, and a control terminal of the fourth N-type transistor MN4 being connected to the amplification stop signal Nc.

In addition, transistors with other functions are also connected to the bit line BLa and the complementary bit line BLb of the sense amplifier 400, which are not shown in the figure because they are less related to the functions mentioned in the embodiments of the present disclosure.

In the embodiment as shown in FIG. 4, the first sense control signal line SABLa is directly connected to the bit line BLa, and the second sense control signal line SABLb is directly connected to the complementary bit line BLb. In other embodiments, the sense amplifier may also have other connection manners.

FIG. 5 is a circuit diagram of a sense amplifier in another embodiment of the present disclosure.

Referring to FIG. 5, in another embodiment, in addition to the parts shown in FIG. 4, the sense amplifier may further include:
- a fifth N-type transistor MN5, a first terminal of the fifth N-type transistor MN5 being connected to the complementary bit line BLb, a second terminal of the fifth N-type transistor MN5 being connected to the second sense control signal line SABLb, a control terminal of the fifth N-type transistor MN5 being connected to an amplification enable signal Iso, and the amplification enable signal Iso being opposite in phase to the amplification stop signal Nc; and
- a sixth N-type transistor MN6, a first terminal of the sixth N-type transistor MN6 being connected to the bit line BLa, a second terminal of the sixth N-type transistor MN6 being connected to the first sense control signal line SABLa, and a control terminal of the sixth N-type transistor MN6 being connected to the amplification enable signal Iso.

Operating principles of the sense amplifier is common knowledge in the field, and thus are not introduced here.

In the embodiments as shown in FIG. 4 and FIG. 5, the signal lines to be tested may include, for example, the bit line BLa, the complementary bit line BLb, the first sense control signal line SABLa, and the second sense control signal line SABLb.

As can be seen from FIG. 5, when the operating state of the sense amplifier is an amplified state, the amplification enable signal Iso is a high-level signal, the amplification stop signal Nc is a low-level signal, the transistors MN5 and MN6 are turned on, the transistors MN3 and MN4 are turned off, the logic state of the bit line BLa is the same as the logic state of the first sense control signal line SABLa, and the logic state of the complementary bit line BLb is the same as the logic state of the second sense control signal line SABLb. That is, SABLa=BLa, and SABLb=BLb. The four signal lines to be tested may have two logic states. According to the operating principles of the sense amplifier, the two logic states are just opposite to each other.

When the operating state of the sense amplifier is an unamplified state, the amplification enable signal Iso is a low-level signal, the amplification stop signal Nc is a high-level signal, the logic state of the bit line BLa is the same as the logic state of the second sense control signal line SABLb, and the logic state of the complementary bit line BLb is the same as the logic state of the first sense control signal line SABLa. That is, SABLa=BLb, and SABLb=BLa. The four signal lines to be tested may have two logic states.

In the circuit as shown in FIG. 4, when the operating state of the sense amplifier is the unamplified state, the amplification stop signal Nc is a high-level signal. That is, SABLa=BLb=SABLb=BLa. The four signal lines to be tested have the same logic state.

A sense amplifier array is arranged between memory arrays. The sense amplifier array includes a plurality of sense amplifiers, and each of the plurality of sense amplifier may have three operating states of a logic 1 amplified state, a logic 0 amplified state, and an unamplified state at a certain moment.

The signal lines to be tested inside different sense amplifiers may be adversely affected by noises of the signal lines to be tested of other sense amplifiers, and the control signal lines such as power lines (e.g., the second power line NCS or the first power line PCS and so on) may also form noise effects on these signal lines to be tested. Now it is generally necessary to manually capture the parasitic capacitances on signal lines Bla, SABLa, BLb, and SABLb from a post-simulation parasitic parameter netlist, including coupling capacitances therebetween; and then the noise parameters of each signal line to be tested under different SA operating combinations are manually calculated. Because SA circuits are reused in the circuit for many times, there are also a lot of signals Bla, SABLa, BLb, and SABLb that need to be captured, generally on the order of thousands, and the operating state relationship between SAs is also relatively complicated. Manual statistical methods are laborious and error-prone. If the layout has been revised, the post-simulation netlist needs to be extracted again, and the above operation needs to be done again.

Using the method provided by the embodiments of the present disclosure to automatically calculate the parasitic capacitances on the signal lines Bla, SABLa, BLb, and SABLb in each SA circuit may greatly improve accuracy and efficiency of circuit analysis.

Figure 6:
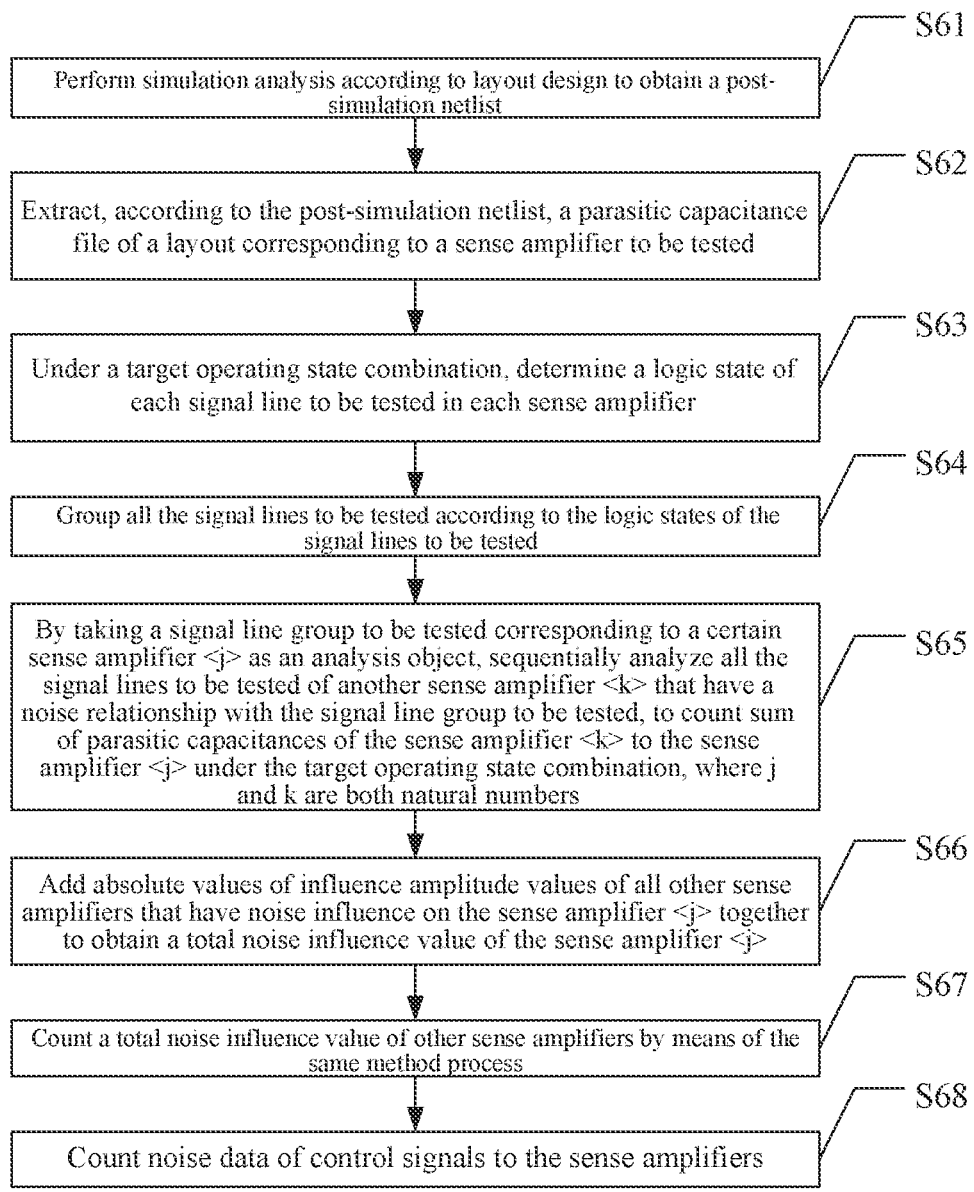
FIG. 6 is a flowchart of calculating noise parameters corresponding to a sense amplifier using a method 100.

FIG. 6 is a flowchart of calculating noise parameters corresponding to a sense amplifier using the method 100.

Referring to FIG. 6, a method 600 may include:

Step S61, performing simulation analysis according to layout design to obtain a post-simulation netlist;

Step S62, extracting, according to the post-simulation netlist, a parasitic capacitance file of a layout corresponding to a sense amplifier to be tested;

Step S63, under a target operating state combination, determining a logic state of each signal line to be tested in each sense amplifier;

Step S64, grouping all the signal lines to be tested according to the logic states of the signal lines to be tested;

Step S65, by taking a signal line group to be tested corresponding to a certain sense amplifier <j> as an analysis object, sequentially analyzing all the signal lines to be tested of another sense amplifier <k> that have a noise relationship with the signal line group to be tested, to count sum of parasitic capacitances of the sense amplifier <k> to the sense amplifier <j> under the target operating state combination, where j and k are both natural numbers;

Step S66, adding absolute values of influence amplitude values of all other sense amplifiers that have noise influence on the sense amplifier <j> together to obtain a total noise influence value of the sense amplifier <j>;

Step S67, counting a total noise influence value of other sense amplifiers by means of the same method process; and Step S68, counting noise data of control signals to the sense amplifiers.

For the sense amplifier <j>, the signal lines to be tested corresponding thereto may be set as SABLa<j>, BLa<j>, SABLb<j>, and BLb<j>. The signal lines to be tested for each sense amplifier form one group, and there are four signals in each group. Assuming that under the target operating state combinations of a plurality of sense amplifiers to be tested, BLa<j>=0, and BLb<j>=1, and in this case, SABLa<j>=0, BLa<j>=0, SABLb<j>=1, and BLb<j>=1. Next, the noise parameters of other sense amplifiers such as the sense amplifier <k> on the sense amplifier <j> may be counted.

Assuming that under the above target operating state combinations, SABLa<k>=1, BLa<k>=1, SABLb<k>=0, and Blb<k>=0. When analyzing an external noise influence of the sense amplifier<k> on the sense amplifier<j>, it is necessary to analyze influences of four signal lines to be tested in the sense amplifier <k> on four signal lines to be tested in the sense amplifier <j>, respectively. According to 16 parasitic capacitance values of the eight signal lines, the noise influence of each signal line to be tested in the sense amplifier <j> is obtained.

For the four signal lines to be tested in the sense amplifier <j>, there exists a corresponding noise influence. For example, for BLa<j>, the parasitic capacitance between BLa<j> and SABLa<k>, the parasitic capacitance between BLa<j> and BLa<k>, the parasitic capacitance between BLa<j> and SABLb<k>, and the parasitic capacitance between BLa<j> and BLb<k> may be added together according to capacitance polarities, to serve as the noise influence of Bla<j> from the sense amplifier <k>.

When the logic states of two signal lines to be tested are the same, the influence is set to be negative, and the polarity of the parasitic capacitance between the two signal lines to be tested is negative. When the logic states of the two signal lines to be tested are opposite, the influence is set to be positive, and the polarity of the parasitic capacitance between the two signal lines to be tested is positive.

Finally, the noise influences (parasitic capacitances) of the four signal lines to be tested in the sense amplifier <j> from the sense amplifier <k> are added together, to obtain the sum of the parasitic capacitances of the sense amplifier <k> on the sense amplifier <j>, namely the noise influence.

The noise influences of other sense amplifiers on the sense amplifier <j> are counted sequentially, and the noise influences of the other sense amplifiers on the sense amplifier <j> are added together, to obtain a classification noise influence of the sense amplifier <j>.

Similarly, the influences of the control signals NCS and PCS on the sense amplifier <j> may be counted, which is not as complicated as between the sense amplifiers, as long as four cases are counted.

For example, when SABLa<j>=0, BLa<j>=0, SABLb<j>=1, and BLb<j>=1, the parasitic capacitances of PCS and NCS on SABLa<j>, BLa<j>, SABLb<j>, and BLb<j> are counted.

NCS may be regarded as logic 0, and PCS may be regarded as logic 1.

The logic state of NCS is the same as those of SABLa<j> and BLa<j>, and is opposite to those of SABLb<j> and BLb<j>. The polarity of the parasitic capacitance between NCS and SABLa<j> is positive, the polarity of the parasitic capacitance between NCS and BLa<j> is positive, the polarity of the parasitic capacitance between NCS and SABLb<j> is negative, and the polarity of the parasitic capacitance between NCS and BLb<j> is negative.

The logic state of PCS is opposite to those of SABLa<j> and BLa<j>, and is the same as those of SABLb<j> and BLb<j>. The polarity of the parasitic capacitance between PCS and SABLa<j> is negative, the polarity of the parasitic capacitance between PCS and BLa<j> is negative, the polarity of the parasitic capacitance between PCS and SABLb<j> is positive, and the polarity of the parasitic capacitance between PCS and BLb<j> is positive.

The parasitic capacitance of NCS and the parasitic capacitances of the four signal lines of the sense amplifier <j> are added together according to the polarities, to obtain the noise influence of NCS on the sense amplifier <j>. Next, the parasitic capacitance of PCS and the parasitic capacitances of the four signal lines of the sense amplifier <j> are added together according to the polarities, to obtain the noise influence of PCS on the sense amplifier <j>. Finally, the noise influence of NCS on the sense amplifier <j> and the noise influence of PCS on the sense amplifier <j> are added together, to obtain the classification noise influence of the control signal line on the sense amplifier <j> under the target operating state combination.

The sum of the classification noise influence corresponding to the control signal line and the classification noise influences corresponding to other sense amplifiers is the total noise influence of the sense amplifier <j> under the target operating state combination.

According to the above process, a value of the parasitic capacitance of each signal line to be tested in each sense amplifier under each operating state combination may be finally obtained, and noise distribution and points needing to be optimized may be drawn and listed efficiently according to the values of the parasitic capacitances, thereby greatly improving the efficiency of the circuit design.

In an exemplary embodiment of the present disclosure, there is further provided an electronic device capable of implementing the above method.

As can be appreciated by one skilled in the art, aspects of the present disclosure may be embodied as a system, method or program product. Accordingly, aspects of the present disclosure may take the form of an entirely hardware embodiment, an entirely software embodiment (including firmware, micro-code, etc.) or an embodiment combining software and hardware aspects that may all generally be referred to herein as a "circuit," "module" or "system."

The electronic device 700 according to this embodiment of the present disclosure is described below with reference to FIG. 7. The electronic device 700 as shown in FIG. 7 is merely an example, and no limitation should be imposed on functions or scope of use of the embodiment of the present disclosure.

Figure 7:
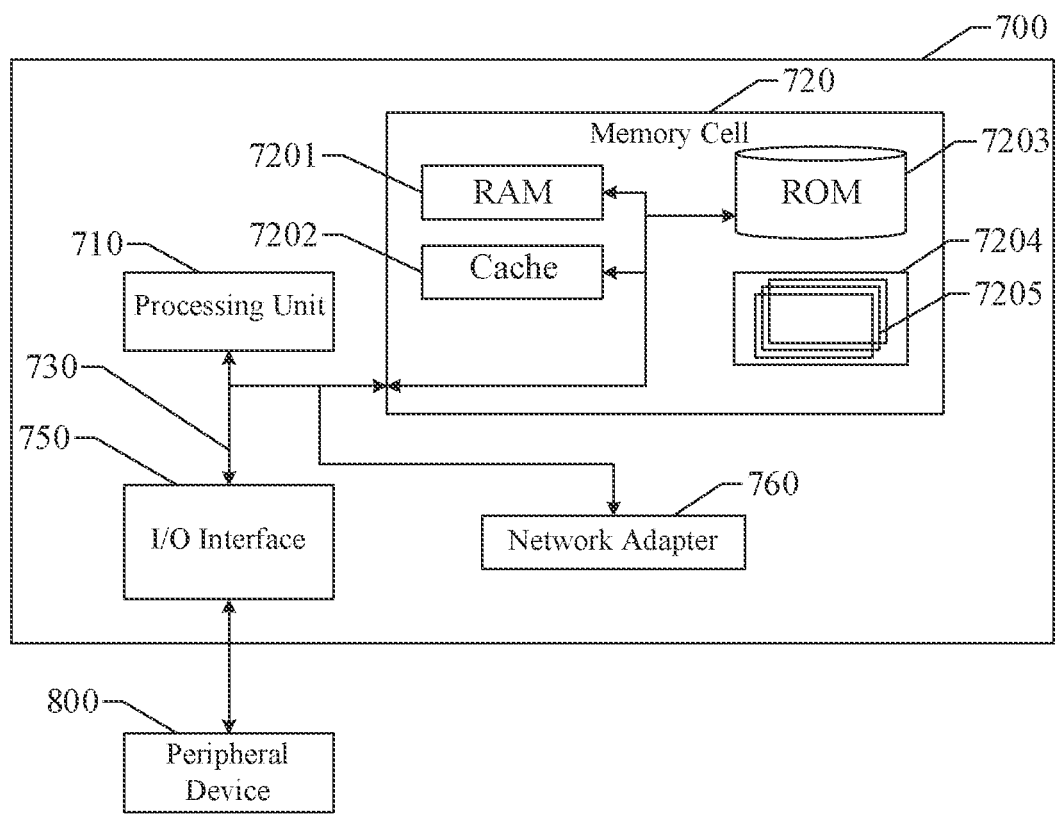
FIG. 7 is a block diagram of an electronic device in an exemplary embodiment of the present disclosure.

As shown in FIG. 7, the electronic device 700 is shown in the form of a general-purpose computing device. Components of the electronic device 700 may include, but are not limited to: at least one processing unit 710, at least one memory cell 720, and a bus 730 connecting different system components (including the memory cell 720 and the processing unit 710).

The memory cell stores a program code, which may be executed by the processing unit 710, such that the processing unit 710 performs steps described in the "exemplary method" portions of the specification according to exemplary embodiments of the present disclosure. For example, the processing unit 710 may perform the methods shown in the embodiments of the present disclosure.

The memory cell 720 may include readable media in the form of volatile memory cell, such as a random access memory (RAM) 7201 and/or a cache memory 7202. Furthermore, the memory cell 720 may further include a read-only memory (ROM) 7203.

The memory cell 720 may include a program/utility tool 7204 having a group of (at least one) program circuits 7205. The program circuits 7205 include, but are not limited to: an operating system, one or more applications, other program circuits and program data. Each or a certain combination of these examples may include implementation of network environment.

The bus 730 may represent one or more of a plurality of bus structures, including a memory bus or memory controller, a peripheral bus, an accelerated graphics port, a processing unit or a local bus using any bus structure among the plurality of bus structures.

The electronic device 700 may communicate with one or more peripheral devices 800 (such as keyboards, pointing devices, Bluetooth devices, etc.), and also may communicate with one or more devices allowing a user to interact with the electronic device 700, and/or may communicate with any device (for example, a router, a modem and so on) allowing the electronic device 700 to communicate with one or more other computing devices. This communication may be implemented by means of an input/output (I/O) interface 750. Moreover, the electronic device 700 also may communicate with one or more networks (for example, a local area network (LAN), a wide area network (WAN) and/or a public network such as the Internet) via a network adapter 760. As shown in FIG. 6, the network adapter 760 communicates with other circuits of the electronic device 700 through the bus 730. It should be understood that although not shown in the figures, other hardware and/or software circuits may be used in combination with the electronic device 700, including but not limited to: microcode, device drivers, redundancy processing units, external disk drive arrays, redundant arrays of independent disks (RAID) systems, tape drives and data backup and storage systems, etc.

With description of the above embodiments, it will be readily understood by those skilled in the art that the exemplary embodiments described herein may be implemented by software or may be implemented by means of software in combination with the necessary hardware. Thus, the technical solutions according to the embodiments of the present disclosure may be embodied in the form of a software product which may be stored in a nonvolatile storage medium (which may be CD-ROM, USB flash disk, mobile hard disk and the like) or on network, including a number of instructions for enabling a computing device (which may be a personal computer, a server, a terminal device, or a network device and the like) to perform the method according to the embodiments of the present disclosure.

In an exemplary embodiment of the present disclosure, there is further provided a computer-readable storage medium storing a program product capable of implementing the above method in this specification. In some possible embodiments, aspects of the present disclosure may be implemented as a form of a program product, which includes a program code. When the program product runs on the terminal device, the program code is used for enabling the terminal device to perform the steps described in the above "exemplary method" portions of this specification according to the exemplary embodiments of the present disclosure.

Moreover, the above accompanying drawings are merely illustrative description of processes included in the method according to the exemplary embodiments of the present disclosure and are not intended to limit the present disclosure. It is easy to understand that the processes shown in the above accompanying drawings do not indicate or limit time sequences of these processes. Furthermore, it is also easy to understand that these processes may be executed, for example, synchronously or asynchronously in a plurality of circuits.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the claims.

INDUSTRIAL APPLICABILITY

According to the embodiments of the present disclosure, a logic state of each signal line to be tested under each circuit operating state combination is determined by automatically obtaining a capacitance between the signal lines to be tested, and then noise parameters of each signal line to be tested under different circuit operating state combinations are automatically calculated out according to different logic states, such that efficiency of obtaining the noise parameters can be greatly improved, and development efficiency of integrated circuits can be effectively improved.

What is claimed is:

1. A method for obtaining circuit noise parameters, comprising:
    determining a plurality of circuits to be tested, each one of the plurality of circuits to be tested comprising one or more signal lines to be tested, and each one of the plurality of circuits to be tested having at least one operating state;
    obtaining a parasitic capacitance between each one of the signal lines to be tested and all others of the signal lines to be tested, and determining a logic state of each one of the signal lines to be tested in each one of the plurality of circuits to be tested under each of the operating states;
    determining a plurality of operating state combinations for the plurality of circuits to be tested, and determining one target operating state combination from the plurality of operating state combinations; and
    under the target operating state combination, determining noise parameters of each one of the signal lines to be tested according to the logic state of each one of the signal lines to be tested and the parasitic capacitance, the noise parameters comprising external noise parameters caused by others of the plurality of circuits to be tested and internal noise parameters of a given one of the plurality of circuits to be tested corresponding to a given one of the plurality of signal lines to be tested;
    wherein the determining a plurality of circuits to be tested comprises:
    obtaining a plurality of functional circuits, and determining whether there is a logic state restriction relationship between different ones of the plurality of functional circuits;
    determining the plurality of functional circuits having the logic state restriction relationship as one of the plurality of circuits to be tested; and
    determining the plurality of functional circuits without the logic state restriction relationship as the plurality of circuits to be tested one by one respectively.

2. The method for obtaining circuit noise parameters according to claim 1, wherein the obtaining a parasitic capacitance between each one of the signal lines to be tested and all others of the signal lines to be tested comprises:
    obtaining the parasitic capacitance based on a post-simulation result.

3. The method for obtaining circuit noise parameters according to claim 1, wherein the logic state comprises a first logic state and a second logic state opposite to each other, the parasitic capacitance between two of the plurality of signal lines to be tested having the same logic state is a first polarity, the parasitic capacitance between two of the plurality of signal lines to be tested having different logic states is a second polarity, and the first polarity is opposite to the second polarity; and the determining noise parameters of each one of the signal lines to be tested according to the logic state of each one of the signal lines to be tested and the parasitic capacitance comprises:
    determining a target signal line from the plurality of signal lines to be tested, and determining all parasitic capacitances corresponding to the target signal line as target parasitic capacitances;
    determining the target parasitic capacitances of the first polarity and the target parasitic capacitances of the second polarity according to the logic state of each one of the signal lines to be tested;
    adding the target parasitic capacitances of the first polarity together to obtain a first capacitance, and adding the target parasitic capacitances of the second polarity together to obtain a second capacitance; and
    obtaining noise parameters of the target signal line on the basis of a difference between an absolute value of the first capacitance and an absolute value of the second capacitance.

4. The method for obtaining circuit noise parameters according to claim 1, further comprising:
    determining one target circuit to be tested from the plurality of circuits to be tested; and
    determining noise parameters corresponding to the plurality of circuits to be tested under the target operating state combination according to noise parameters of all of the plurality of signal lines to be tested corresponding to the target circuit to be tested.

5. The method for obtaining circuit noise parameters according to claim 1, wherein each of the plurality of signal lines to be tested further comprises a control signal line, the control signal line comprising a power line and a signal line configured to transmit an enable signal.

6. The method for obtaining circuit noise parameters according to claim 4, wherein the determining noise parameters corresponding to the plurality of circuits to be tested under the target operating state combination according to noise parameters of all of the plurality of signal lines to be tested corresponding to the target circuit to be tested comprises:
    determining all of the plurality of signal lines to be tested corresponding to the target circuit to be tested as target signal lines;
    determining classifications of all of the plurality of signal lines to be tested according to signal types;
    taking sum of a plurality of parasitic capacitances between all the target signal lines and the plurality of signal lines to be tested of one classification as classification noise parameters of the target circuit to be tested; and
    taking sum of all the classification noise parameters corresponding to the target circuit to be tested as the noise parameters corresponding to the target circuit to be tested.

7. The method for obtaining circuit noise parameters according to claim 4, further comprising:
    setting each one of the plurality of operating state combinations as the target operating state combination, to obtain noise parameters of each one of the signal lines to be tested corresponding to each one of the plurality of operating state combinations; and
    setting each one of the plurality of circuits to be tested as the target circuit to be tested, to obtain the noise parameters corresponding to each one of the plurality of circuits to be tested under each one of the plurality of operating state combinations.

8. The method for obtaining circuit noise parameters according to claim 1, wherein each of the plurality of circuits to be tested comprises a sense amplifier; and the determining a plurality of circuits to be tested comprises:

determining logic states of the plurality of signal lines to be tested corresponding to the sense amplifier in different operating states, the operating states comprising at least an amplified state and an unamplified state, and the amplified state comprising an amplified state where a bit line is in a first logic state and an amplified state where the bit line is in a second logic state.

9. The method for obtaining circuit noise parameters according to claim 8, wherein each of the plurality of signal lines to be tested comprises a bit line, a complementary bit line, a first sense control signal line, and a second sense control signal line; when the operating state of the sense amplifier is the amplified state, the logic state of the bit line is the same as the logic state of the first sense control signal line, and the logic state of the complementary bit line is the same as the logic state of the second sense control signal line; and when the operating state of the sense amplifier is the unamplified state, the logic state of the bit line is the same as the logic state of the second sense control signal line, and the logic state of the complementary bit line is the same as the logic state of the first sense control signal line.

10. The method for obtaining circuit noise parameters according to claim 8, wherein the sense amplifier comprises:
 a first P-type transistor, a source of the first P-type transistor being electrically connected to a first power line, a drain of the first P-type transistor being connected to the first sense control signal line, and a gate of the first P-type transistor being connected to the second sense control signal line;
 a second P-type transistor, a source of the second P-type transistor being electrically connected to the first power line, a drain of the second P-type transistor being connected to the second sense control signal line, and a gate of the second P-type transistor being connected to the first sense control signal line;
 a first N-type transistor, a source of the first N-type transistor being electrically connected to a second power line, a drain of the first N-type transistor being connected to the first sense control signal line, and a gate of the first N-type transistor being connected to the complementary bit line;
 a second N-type transistor, a source of the second N-type transistor being electrically connected to the second power line, a drain of the second N-type transistor being connected to the second sense control signal line, and a gate of the second N-type transistor being connected to the bit line;
 a third N-type transistor, a first terminal of the third N-type transistor being connected to the complementary bit line, a second terminal of the third N-type transistor being connected to the first sense control signal line, and a control terminal of the third N-type transistor being connected to an amplification stop signal; and
 a fourth N-type transistor, a first terminal of the fourth N-type transistor being connected to the bit line, a second terminal of the fourth N-type transistor being connected to the second sense control signal line, and a control terminal of the fourth N-type transistor being connected to the amplification stop signal.

11. The method for obtaining circuit noise parameters according to claim 10, wherein the first sense control signal line is directly connected to the bit line, and the second sense control signal line is directly connected to the complementary bit line.

12. The method for obtaining circuit noise parameters according to claim 10, wherein the sense amplifier further comprises:
 a fifth N-type transistor, a first terminal of the fifth N-type transistor being connected to the complementary bit line, a second terminal of the fifth N-type transistor being connected to the second sense control signal line, a control terminal of the fifth N-type transistor being connected to an amplification enable signal, and the amplification enable signal being opposite in phase to the amplification stop signal; and
 a sixth N-type transistor, a first terminal of the sixth N-type transistor being connected to the bit line, a second terminal of the sixth N-type transistor being connected to the first sense control signal line, and a control terminal of the sixth N-type transistor being connected to the amplification enable signal.

13. An electronic device comprising:
 a memory; and
 a processor coupled to the memory, the processor being configured to perform, based on instructions stored in the memory, the method for obtaining circuit noise parameters according to claim 1.

14. A non-transitory computer-readable storage medium storing a program thereon, the program is executable by a processor to implement the method for obtaining circuit noise parameters according to claim 1.

15. A method for obtaining circuit noise parameters, comprising:
 determining a plurality of circuits to be tested, each one of the plurality of circuits to be tested comprising one or more signal lines to be tested, and each one of the plurality of circuits to be tested having at least one operating state;
 obtaining a parasitic capacitance between each one of the signal lines to be tested and all others of the signal lines to be tested, and determining a logic state of each one of the signal lines to be tested in each one of the plurality of circuits to be tested under each of the operating states;
 determining a plurality of operating state combinations for the plurality of circuits to be tested, and determining one target operating state combination from the plurality of operating state combinations; and
 under the target operating state combination, determining noise parameters of each one of the signal lines to be tested according to the logic state of each one of the signal lines to be tested and the parasitic capacitance, the noise parameters comprising external noise parameters caused by others of the plurality of circuits to be tested and internal noise parameters of a given one of the plurality of circuits to be tested corresponding to a given one of the plurality of signal lines to be tested;
 wherein the logic state comprises a first logic state and a second logic state opposite to each other, the parasitic capacitance between two of the plurality of signal lines to be tested having the same logic state is a first polarity, the parasitic capacitance between two of the plurality of signal lines to be tested having different logic states is a second polarity, and the first polarity is opposite to the second polarity; and the determining noise parameters of each one of the signal lines to be tested according to the logic state of each one of the signal lines to be tested and the parasitic capacitance comprises:

determining a target signal line from the plurality of signal lines to be tested, and determining all parasitic capacitances corresponding to the target signal line as target parasitic capacitances;

determining the target parasitic capacitances of the first polarity and the target parasitic capacitances of the second polarity according to the logic state of each one of the signal lines to be tested;

adding the target parasitic capacitances of the first polarity together to obtain a first capacitance, and adding the target parasitic capacitances of the second polarity together to obtain a second capacitance; and obtaining noise parameters of the target signal line on the basis of a difference between an absolute value of the first capacitance and an absolute value of the second capacitance.

16. A method for obtaining circuit noise parameters, comprising:

determining a plurality of circuits to be tested, each one of the plurality of circuits to be tested comprising one or more signal lines to be tested, and each one of the plurality of circuits to be tested having at least one operating state;

obtaining a parasitic capacitance between each one of the signal lines to be tested and all others of the signal lines to be tested, and determining a logic state of each one of the signal lines to be tested in each one of the plurality of circuits to be tested under each of the operating states;

determining a plurality of operating state combinations for the plurality of circuits to be tested, and determining one target operating state combination from the plurality of operating state combinations; and under the target operating state combination, determining noise parameters of each one of the signal lines to be tested according to the logic state of each one of the signal lines to be tested and the parasitic capacitance, the noise parameters comprising external noise parameters caused by others of the plurality of circuits to be tested and internal noise parameters of a given one of the plurality of circuits to be tested corresponding to a given one of the plurality of signal lines to be tested;

determining one target circuit to be tested from the plurality of circuits to be tested; and determining noise parameters corresponding to the plurality of circuits to be tested under the target operating state combination according to noise parameters of all of the plurality of signal lines to be tested corresponding to the target circuit to be tested;

wherein the determining noise parameters corresponding to the plurality of circuits to be tested under the target operating state combination according to noise parameters of all of the plurality of signal lines to be tested corresponding to the target circuit to be tested comprises:

determining all of the plurality of signal lines to be tested corresponding to the target circuit to be tested as target signal lines;

determining classifications of all of the plurality of signal lines to be tested according to signal types;

taking sum of a plurality of parasitic capacitances between all the target signal lines and the plurality of signal lines to be tested of one classification as classification noise parameters of the target circuit to be tested; and taking sum of all the classification noise parameters corresponding to the target circuit to be tested as the noise parameters corresponding to the target circuit to be tested.

* * * * *